United States Patent [19]
Duncan

[11] 4,052,785
[45] Oct. 11, 1977

[54] METHOD OF MAKING A TRANSFORMER ASSEMBLY
[75] Inventor: John D. Duncan, Bozeman, Mont.
[73] Assignee: Dana Corporation, Toledo, Ohio
[21] Appl. No.: 635,820
[22] Filed: Nov. 28, 1975
[51] Int. Cl.² .................................. H01F 41/08
[52] U.S. Cl. .................................. 29/605; 363/171; 325/446; 336/182; 336/184; 336/221; 340/174 CT
[58] Field of Search ........ 325/446; 321/69 R, 69 NL, 321/69 W; 340/174 CT; 29/605, 628; 336/180, 182, 183, 184, 171, 221; 333/25, 26

[56] References Cited
U.S. PATENT DOCUMENTS

| 3,341,832 | 9/1967 | Nitzan | 340/174 CT |
| 3,449,704 | 6/1969 | Matsushima et al. | 336/221 |
| 3,548,492 | 12/1970 | Weber | 29/602 |
| 3,590,480 | 7/1971 | Johnson, Jr. et al. | 29/605 |
| 3,772,599 | 11/1973 | Ernst et al. | 325/446 |
| 3,783,415 | 1/1974 | Koskinen | 333/25 |

Primary Examiner—Carl E. Hall
Attorney, Agent, or Firm—Robert M. Leonardi

[57] ABSTRACT

Disclosed is a double balanced mixer using a novel single ferrite core construction. The core includes two apertures and a transformer is wound through each aperture. The two transformers are connected by diodes in the known manner to provide the mixer. The arrangement lends itself to simple construction and provides a mixer which is smaller than heretofore possible and which exhibits exceptional high frequency response and flatness with satisfactory isolation.

3 Claims, 9 Drawing Figures

METHOD OF MAKING A TRANSFORMER ASSEMBLY

BACKGROUND OF THE INVENTION

This invention relates to electrical signal mixers and particularly to double balanced mixers.

Double balanced mixers have been known and used for many years and utilize two transformers linked by a diode network. Performance of such a device is measured in terms of the conversion loss and the isolation among the local oscillator (L.O.) intermediate frequency (I.F.) and/or radio frequency (R.F.) signals.

Conventional prior art mixers utilize two separate toroidal care transmformers. Such construction has been generally satisfactory but has limited the minimum practical size of the mixer. For certain applications it is desirable to simplify the mixer construction. At the same time the performance of the mixer must be maintained or improved.

It is, therefore, an object of the present invention to provide an improved double balanced mixer which is smaller and easier to construct than those presently available.

It is a further object of the invention to provide such a mixer with performance equal or superior to that presently available.

SUMMARY OF THE INVENTION

These and other objects are achieved in a mixer using a double apertured ferrite core. A transformer is wound through each aperture and the two transformers are interconnected in the customary manner. This improved construction simplifies assembly and reduces the size of the mixer. Surprisingly the use of a single core also improves the performance of the mixer in spite of the increased opportunity for undesirable interaction among the signals within the core.

BRIEF DESCRIPTION OF THE DRAWINGS

While the specification concludes with claims which particularly and distinctly claim the invention it is believed that the same will be better understood with reference to the following description taken in conjunction with the accompanying drawings in which:

DESCRIPTION OF THE PREFERRED EMBODIMENTS

Figure 1:
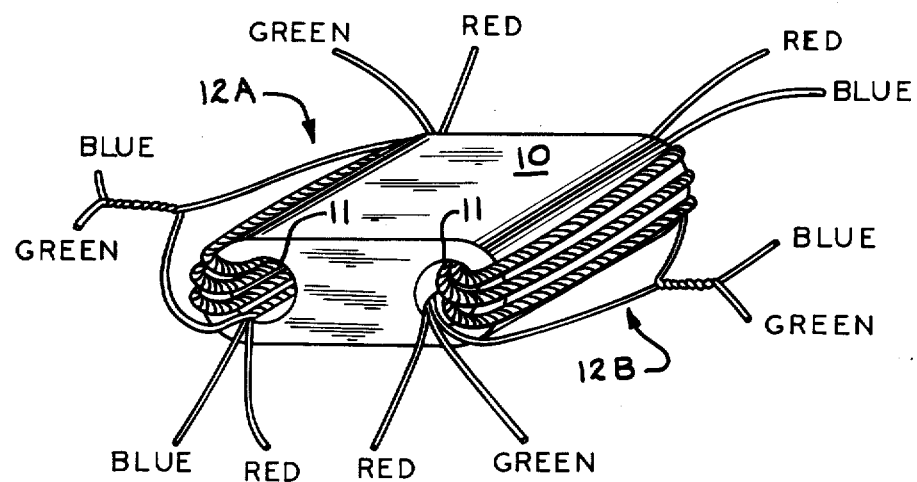
FIG. 1 is an isometric view of a preferred embodiment of the transformers of the present invention.

Turning now to the drawings, FIG. 1 shows the transformers for use in the present invention in a preferred embodiment. The transformers are wound on a unitary core 10 consisting of a single piece of magnetic material such as ferrite or the like as commonly used in electrical equipment. The core 10 defines two apertures 11 axially therethrough. For typical low power applications; e.g., local oscillator (L.O.) input of about 5 miliwatts at 1-1000 megahertz and intermediate frequency of about 0.5 miliwatts at 1-1000 megahertz the core 10 will typically be about 1 inch (2.5 cm.) in the axial direction, about 1.4 inches (3.6 cm.) in width and about 0.83 inch (2.1 cm.) in thickness. The two apertures 11 are cylindrical and parallel, about 0.31 inch (0.8 cm.) in diameter and on centers spaced by about 0.57 inch (1.45 cm.).

The lateral edges of the core 10 are preferably semicircular in cross section and concentric with the apertures 11 thereby forming a half of a cylindrical shell about the apertures 11. It will be noted that the lateral spacing between the apertures 11 is less than twice the width of the half cylindrical shells and, accordingly, an isolation problem would be expected to exist. While there is a limited loss of isolation at low frequencies, as discussed below, such loss is acceptably low. Moreover, and unexpectedly, at the relatively high frequencies more commonly used with the present invention isolation is at least as good as that provided by the prior art. Of course, still greater physical separation of the transformer coils may be used to provide still further electrical isolation.

Two sets of windings 12A and 12B are provided on the core 10, each associated with one aperture 11 and forming, together with the core 10, one transformer. Each set of windings 12A and 12B consists of three separate coils which are coded, typically by color, for identification and are designated as red, blue and green herein. Preferably the three wires forming the three coils are provided as a three wire cable 13. Typically, each coil will consist of three turns.

Figure 2:
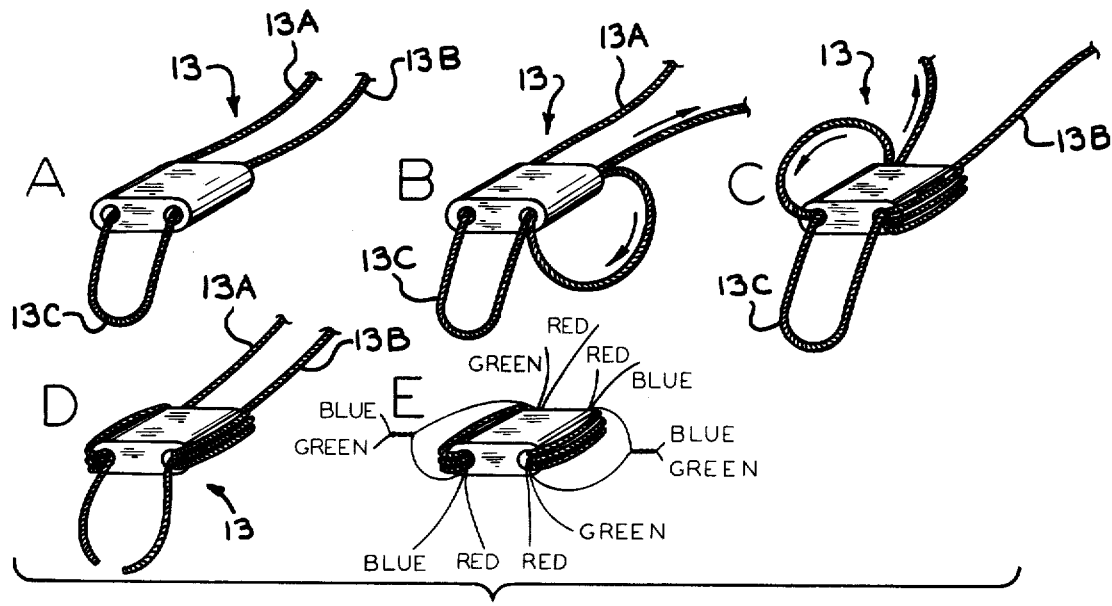
FIGS. 2 A-E illustrate the preferred sequence of steps for forming the transformers of FIG. 1.

As illustrated in FIG. 2 the transformers can be assembled simply by winding a single three wire twisted cable 13 through the two apertures. As seen in FIG. 2A, the two ends 13A and 13B of cable 13 are first passed through respective ones of the two apertures 11 in the same direction. The central portion of the cable 13 is left as an extended loop 13C. The ends 13A and 13B are then successively looped around and passed through the apertures in the same direction as many times as required to form the desired number of turns as shown in FIGS. 2B and 2C. The loop 13C is cut at any convenient point in the process and preferably after the winding is complete, thereby separating the two sets of transformer windings. Thereafter, a connection is made between a wire extending from one end of each winding and one of the other two wires of the cable extending from the other end of the same winding. Referring again to FIG. 1, for example, a blue wire from one end of each winding is connected to a green wire from the other end of the same winding.

While any connections consistent with the above description will achieve the desired results it is preferred that wires of the same colors be selected from diagonally opposite corners of the core 10. Again referring to FIG. 1 by way of example it can be seen that the blue leads from one pair of diagonally opposite corners has been selected while the green leads from the other two corners are used. The advantage to such a construction is that it results in a symmetrical pair of transformers the leads from which require no identification to orient them properly in subsequent assembly as will hereinafter more fully be described.

Figure 3:
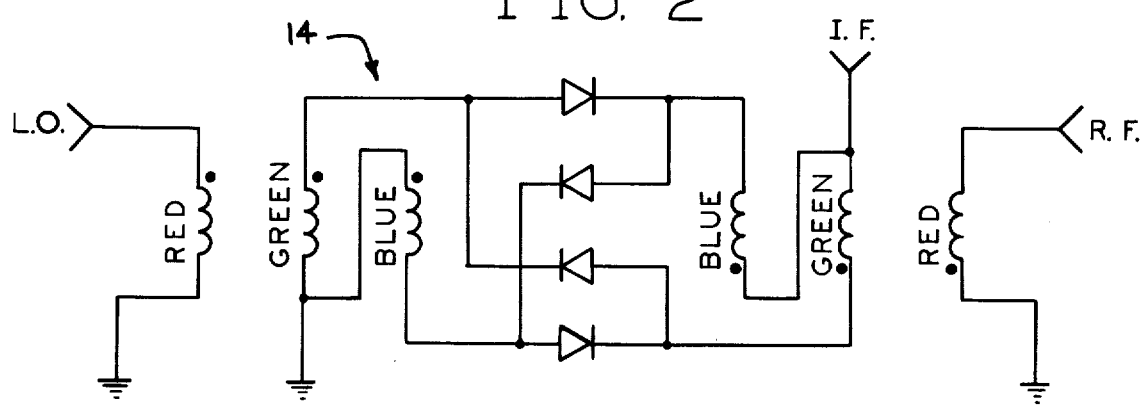
FIG. 3 is a schematic representation of a mixer circuit into which the transformers of FIG. 1 is incorporated.

The mixer of the present invention is shown schematically in FIG. 3 and is designated generally by the numeral 14. In terms of the interconnection of the circuit elements, the mixer 14 is a conventional double balanced mixer useful, for example, in mixing a high level "local oscillator" signal designated as "L.O." with an input signal generally referred to as the intermediate frequency signal (and designated "I.F." in the drawing) to produce a radio frequency signal ("R.F." in the drawing). The transformers shown in FIG. 1 are used in the conventional "double balanced mixer" circuit of FIG. 3 and are connected by a conventional diode network. The "dots" shown in conjunction with the winding symbols designate the "polarity" of the windings. As can be seen, the symmetry of the two transformers 12A and 12B on the core 10 resulting from the aforedescribed preferred transformer arrangement makes it immaterial which of the transformers is used for the local oscillator side and which is used for the radio frequency side. This obviously simplifies construction of the mixer. The use of a single core 10 also allows miniaturization of the mixer 14 to a degree not previously possible or only attainable with greater difficulty.

The transformers 12A and 12B and the interconnecting diode network can be packaged in any desired manner and the size of the mixer of the present invention allows the use, for instance, of a conventional four lead transistor "package" such as that commonly designated as a "TO-5" case thereby allowing ready incorporation of the mixer in a circuit. Typical considerations, such as attention to lead lengths, associated with high frequency components should, of course, be observed in constructing the mixers of the present invention.

Figure 4:
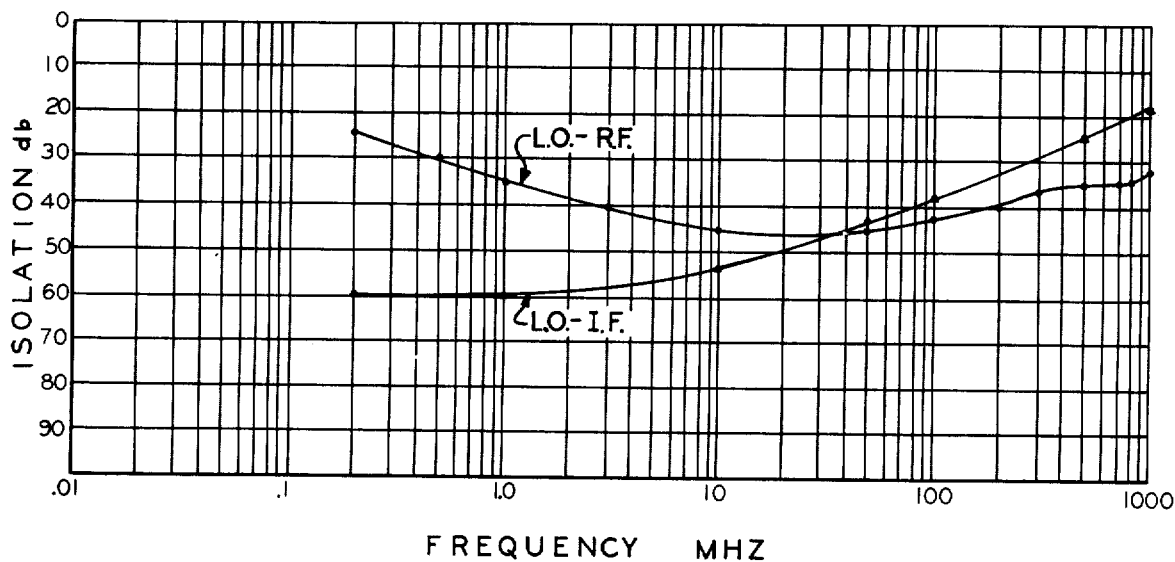
FIG. 4 is a graph illustrating the isolation between the local oscillator and intermediate and radio frequency windings of the mixer of FIG. 3 at various frequencies; and, FIG. 5 is a graph of the conversion loss of the mixer of FIG. 3 at various frequencies.

The mixer of the present invention also has excellent performance characteristics compared to prior art devices which is surprising in view of the lack of physical isolation of the two tranformers 12A and 12B. FIG. 4 graphically shows the isolation between the local oscillator (L.O.) signal and the intermediate and radio frequency signals at various frequencies. As is customary for mixers of this type the isolation is defined as the ratio, in decibels, between the signal input at one of the mixer ports to the level of the same signal (i.e., the signal at the same frequency) at one of the other two ports. As can be seen, for example the isolation between the L.O. and R.F. ports is 40db or greater between about 3 and 200 MhZ.

In practice the ports of the mixer are largely interchangeable depending on application. Both the L.O. and R.F. ports can be used for signals with frequencies ranging, for example, from about 500 kilohertz to 1000 megahertz. The I.F. port is suitable for frequencies from about 1000 megahertz down to D.C. Thus, the inputs may be to any two ports consistent with these general limitations and the output, consisting of the sum and the diffeerence of the two inputs will appear at the third port. Because of this interchangeability, the isolation of the device is even better than that indicated by either of the curves in FIG. 4 taken alone since connections can be made to the pair of ports having the greater isolation at the frequency of interest.

Figure 5:
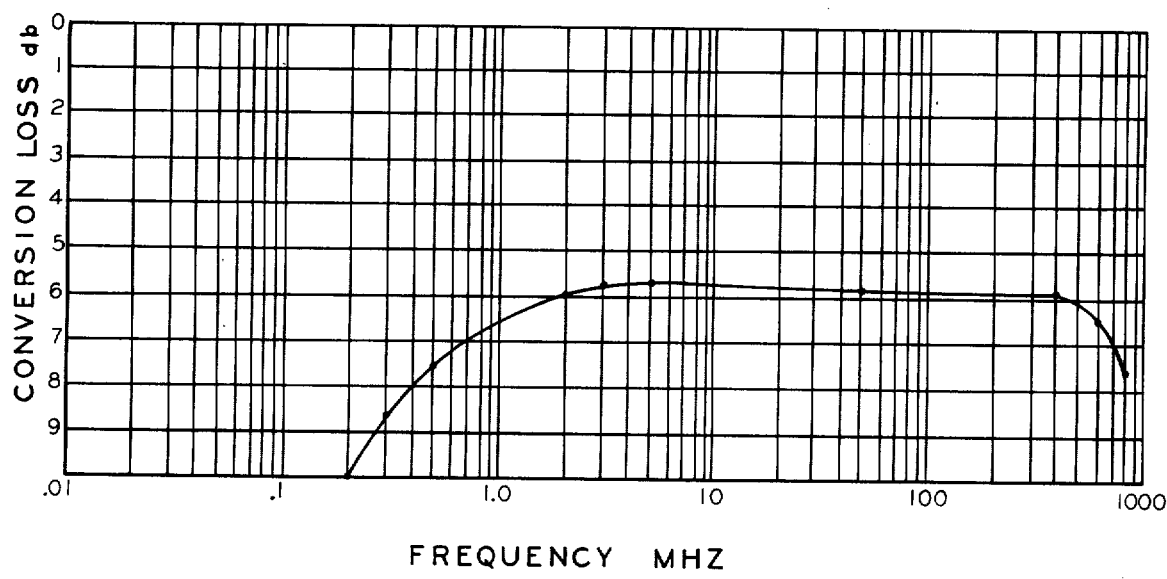

The conversion loss of the device is shown in FIG. 5. The conversion loss is defined as the ratio, in decibels, of (I.F.) signal level to one of the output (R.F.) sidebands in a 50 ohm system with a local oscillator (L.O.) drive level of +7 decibels means (dbm) available power. (+7 dbm is that power associated with 0.5 volts driving into 50 ohms). Since the input signal is divided into two components at the output (the upper and lower sidebands) there is an inherent conversion loss, based on the above definition, of fifty per cent or 3 decibels. With reference to FIG. 5 it will be seen that the total conversion loss (including the inherent 3 decibel loss) for the mixer of the present invention is substantially constant and somewhat less than six decibels over the frequency range of 2-250 MhZ. Such performance is considered excellent for double balanced mixers.

In summary, the present invention provides a double balanced mixer transformer which can readily be assembled and which, in a preferred embodiment is symmetrical, obviating any possible errors in assembly due to connections of incorrect polarity. The transformer is also very compact following further miniaturization without loss of performance. The invention has been described with respect to the preferred embodiment but those skilled in the art will appreciate that many modifications are possible within the spirit and scope of the following claims.

What I claim is:

1. A method of forming a transformer assembly comprising: providing a single core of magnetic material, said core defining two apertures therethrough, said apertures being symmetrically located with respect to each other and with respect to said core; winding a coded three wire cable through each of said apertures providing two ends of said cable corresponding to each aperture; and interconnecting one wire from one end of each cable with a different wire from the other end of the same cable such that diagonally corresponding ones of the wires are interconnecting whereby the transformer is symmetrical.

2. The method of claim 1 wherein the cable wound through each aperture is a separate cable and wherein said separate cables are similarly coded.

3. The method of claim 1 wherein said cable wound through each of said apertures is a single cable and said single cable is formed into a loop between said apertures, and wherein the providing two ends of said cable corresponding to each aperture comprises severing said single cable at said loop.

* * * * *